US009965580B2

(12) United States Patent
Gou et al.

(10) Patent No.: US 9,965,580 B2
(45) Date of Patent: May 8, 2018

(54) RANKING COMBINATIONS OF MUTANTS, TEST CASES AND RANDOM SEEDS IN MUTATION TESTING

(71) Applicant: International Business Machines Corporation, Armonk, NY (US)

(72) Inventors: Peng Fei Gou, Shanghai (CN); Bodo Hoppe, Boeblingen (DE); Yang Li, Shanghai (CN); Dan Liu, Beijing (CN); Yang Liu, Shanghai (CN)

(73) Assignee: NTERNATIONAL BUSINESS MACHINES CORPORATION, Armonk, NY (US)

( * ) Notice: Subject to any disclaimer, the term of this patent is extended or adjusted under 35 U.S.C. 154(b) by 54 days.

(21) Appl. No.: 14/748,309

(22) Filed: Jun. 24, 2015

(65) Prior Publication Data

US 2015/0379187 A1    Dec. 31, 2015

(30) Foreign Application Priority Data

Jun. 26, 2014   (CN) .......................... 2014 1 0293660

(51) Int. Cl.
*G06F 17/50* (2006.01)

(52) U.S. Cl.
CPC ................................ *G06F 17/5081* (2013.01)

(58) Field of Classification Search
CPC ................................................... G06F 17/5081
See application file for complete search history.

(56) References Cited

U.S. PATENT DOCUMENTS

| 6,782,515 | B2 | 8/2004 | Scott et al. |
| 7,337,154 | B2 | 2/2008 | Manson |

(Continued)

FOREIGN PATENT DOCUMENTS

| CN | 101620566 | 1/2010 |
| CN | 102831064 | 12/2012 |

OTHER PUBLICATIONS

Tao Xie, Wolfgang Mueller, Florian Letombe, Efficient Mutation-Analysis Coverage for Constrained Random Verification, Sep. 20-23, 2010. http://link.springer.com/chapter/10.1007%2F978-3-642-15234-4_12.

(Continued)

*Primary Examiner* — Vuthe Siek
(74) *Attorney, Agent, or Firm* — Steven Meyers; Andrew M. Calderon; Roberts Mlotkowski Safran Cole & Calderon, P.C.

(57) ABSTRACT

A method and apparatus for ranking combinations of mutants, test cases and random seeds in mutation testing, comprising obtaining, based on a signal of a test case target, logic gates related to the signal of the test case target and mutants on the related logic gates, for a compiled integrated circuit under test; calculating distances between the mutants and the signal of the test case target; performing a circuit simulation on the compiled integrated circuit under test to obtain activation cycle numbers corresponding to combinations of the mutants, test cases and random seeds; obtaining activation cycle number variances corresponding to combinations of the mutants and the test cases; and ranking the combinations of the mutants, the test cases and the random seeds based on the distances, the activation cycle numbers and the activation cycle number variances. The invention can reduce the probability that the mutation simulation selects equivalent mutants.

19 Claims, 5 Drawing Sheets

(56) References Cited

U.S. PATENT DOCUMENTS

| | | |
|---|---|---|
| 7,711,992 B2 | 5/2010 | Coulter et al. |
| 7,729,891 B2 | 6/2010 | Fine et al. |
| 7,752,006 B2 | 7/2010 | Copty et al. |
| 7,877,659 B2 | 1/2011 | Geller et al. |
| 8,311,793 B2 | 11/2012 | Grosse et al. |
| 2007/0294655 A1* | 12/2007 | Campos ............. G06F 17/5009 716/106 |
| 2009/0089771 A1 | 4/2009 | Gill et al. |
| 2014/0136900 A1* | 5/2014 | Wei .................... G06F 11/3692 714/37 |

OTHER PUBLICATIONS

Tao Xie, Wolfgang Mueller, Florian Letombe, Mutation-Analysis Driven Functional Verification of a Soft Microprocessor, Sep. 12-14, 2012. http://www.ieeexplore.net/xpl/articleDetails.jsp?tp=&arnumber=6398362&searchWithin%3Dmutant%26searchWithin%3Dhardware%26queryText%3Dfunctional+verification.

Stephane Bouvier, Nicolas Sauzede, Florian Letombe, Julien Torres, Functional Qualification of TLM Verification, 2009. http://www.date-conference.com/proceedings/PAPERS/2009/DATE09/PDFFIELS/03.4_2.PDF.

Y Serrestou, V Beroulle, C Robach, Functional Verification of RTL Designs Driven by Mutation Testing Metrics Aug. 29-31, 2007 http://www.ieeexplore.net/xpl/articleDetails.jsp?tp=&arnumber=4341472&searchWithin%3Dmutant%26searchWithin%3Dhardware%26queryText%3Dfunctional+verification.

* cited by examiner

| Signals at input and output pins of a specific module | Signals of specific register bits | Signals of specific states of an internal state machine |

RANKING COMBINATIONS OF MUTANTS, TEST CASES AND RANDOM SEEDS IN MUTATION TESTING

TECHNICAL FIELD

The present invention relates to quality evaluation of an integrated circuit testing platform, and more specifically, to a method and apparatus for ranking combinations of mutants, test cases and random seeds in mutation testing.

BACKGROUND

Functional verification is a method for ensuring the functional correctness of an integrated circuit, and occupies an important position in an integrated circuit design flow. A high-quality functional verification platform is a premise for ensuring the whole flow credible and reliable, and further ensuring the functional correctness of the integrated circuit. Mutation testing may evaluate the quality of the functional verification platform so that a verification engineer can quantitatively give evaluation criteria.

The basic steps of the current mutation testing are divided into three parts: 1) randomly selecting at least one mutant after generating mutants for multiple logic gates of a compiled integrated circuit under test. Here, the integrated circuit under test may be described with a Hardware Description Language (HDL), and may be compiled with tools such as NCVerilog, NCVHDL, Portals, etc. Here, the mutation refers to changing the function of a certain logic gate in the integrated circuit under test, for example, changing the function of an "AND" logic gate into an "OR/XOR/XNOR" logic gate. In a word, it is called a mutant as long as its function is different from the "AND." Generating mutants for multiple logic gates of the compiled integrated circuit under test is the prior art, and it may be implemented using the existing methods for changing functions of logic gates and changing the number of inputs and outputs of the logic gates.

2) Performing a mutation testing simulation for the integrated circuit under test. The mutation testing simulation is very similar to an ordinary circuit simulation, and the only difference is enabling the mutation during the simulation. During each mutation testing simulation, only one mutant and one test case can be used. Here, the test case refers to, according to a test target, adding a series of inputs to the integrated circuit under test, and observing by a checker whether outputs of the integrated circuit under test conform to the expected states. Each group of input signals plus a corresponding checking policy is called one test case. For example, if it is to test the function of an "AND" logic gate having two input signals, it is necessary to add different values, i.e. <1, 1>; <1, 0>; <0, 1>; <0, 0> to the two input signals of the "AND" logic gate; each group of input values has a desired output check, for example, when the input is <1, 1>, the desired output is 1; when the input is <1, 0>, the desired output is 0, and so on. Here, each group of input values is the test case for the "AND" logic gate.

3) Giving quantitative evaluation criteria for the quality of the functional verification platform by synthesizing a series of logical function changes and their observation results. That is, steps 1 and 2 are executed recurrently to obtain the mutation testing results of a series of logic gates. Based on the obtained results, it is observed whether the functional verification platform can normally check a change in the logical function of the integrated circuit under test. For example, in the above "AND" gate case, if the input signal is <0, 1>, the output result of the "AND" gate should be 0, and the functional verification platform should also expect that the output result is 0. If the function of the "AND" gate is changed into "OR," then the output is now changed into 1, and at this time it is necessary to observe whether the functional verification platform can normally report an error because the functional verification platform deems that the logical function is still the "AND." If the functional verification platform does not report an error, it means that it does not normally detect the change of the logical function, and then there must be something wrong with the checker.

When performing the mutation testing, if it is to accurately observe whether the functional verification platform can detect changes of all logical functions, it is better to test all mutants against all test cases. Supposing that there exist 1 million mutants, using 50 test cases, 4 random seeds, and each simulation lasting 1 hour, then it needs to perform the mutation testing simulation for 200 million hours. When randomly selecting a mutant, if in a certain simulation, since the testing stimulus generated by the current test case cannot activate the mutant, the result of this simulation is consistent with that without mutation, and this simulation becomes an invalid simulation, and the mutant is called an Equivalent Mutant. The cause of the equivalent mutant is that the current test case does not add to the mutant with an input signal that may cause the function of the mutant to change. Again, taking the above "AND" logic gate as an example, if the "AND" is mutated to "OR," while there are only two test cases, one is for the input signal <1, 1> and the other is for the input signal <0, 0>, then the outputs of the two input signals are the same for the "AND" and "OR", and the functions do not change, and thus the mutant is not activated.

In order to improve efficiency for the quality evaluation of the functional verification platform, it is necessary to reduce equivalent mutants.

SUMMARY

The equivalent mutant is related to the mutant per se, the test case, and even the random seed used in the simulation. In the prior art, since the mutants generated for multiple logical gates are selected randomly in the test, the probability that the selected mutant may be the equivalent mutant is large, thereby causing an invalid simulation. The method and system provided by the prevent invention can rank the combinations of mutants, test cases and random seeds, and thereby can reduce the probability for selecting the equivalent mutant, and thus can reduce the invalid simulation and improve the efficiency for quality evaluation of the functional verification platform within limited testing time.

According to one aspect of the present invention, there is provided a method for ranking combinations of mutants, test cases and random seeds in mutation testing, comprising:
  obtaining, based on a signal of a test case target, logic gates related to the signal of the test case target and mutants on the related logic gates for a compiled integrated circuit under test;
  calculating distances between the mutants and the signal of the test case target;
  performing a circuit simulation on the compiled integrated circuit under test to obtain activation cycle numbers corresponding to combinations of the mutants, test cases and random seeds;
  obtaining activation cycle number variances corresponding to combinations of the mutants and the test cases; and ranking the combinations of the mutants, the test cases and the random seeds based on the distances, the activation cycle numbers and the activation cycle number variances.

According to another aspect of the present invention, there is provided an apparatus for ranking combinations of mutants, test cases and random seeds in mutation testing, comprising:

a related logic gate and mutant thereon obtaining module configured to obtain, based on a signal of a test case target, logic gates related to the signal of the test case target and mutants on the related logic gates, for a compiled integrated circuit under test;

a distance calculating module configured to calculate distances between the mutants and the signal of the test case target;

an activation cycle number obtaining module configured to perform a circuit simulation on the compiled integrated circuit under test to obtain activation cycle numbers corresponding to combinations of the mutants, test cases and random seeds;

an activation cycle number variance obtaining module configured to obtain activation cycle number variances corresponding to combinations of the mutants and the test cases; and a ranking module configured to rank the combinations of the mutants, the test cases and the random seeds based on the distances, the activation cycle numbers and the activation cycle number variances.

BRIEF DESCRIPTION OF THE SEVERAL VIEWS OF THE DRAWINGS

Through the more detailed description of exemplary embodiments of the present disclosure in the accompanying drawings, the above and other objects, features and advantages of the present disclosure will become more apparent, wherein the same reference generally refers to the same components in the exemplary embodiments of the present disclosure.

DETAILED DESCRIPTION

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
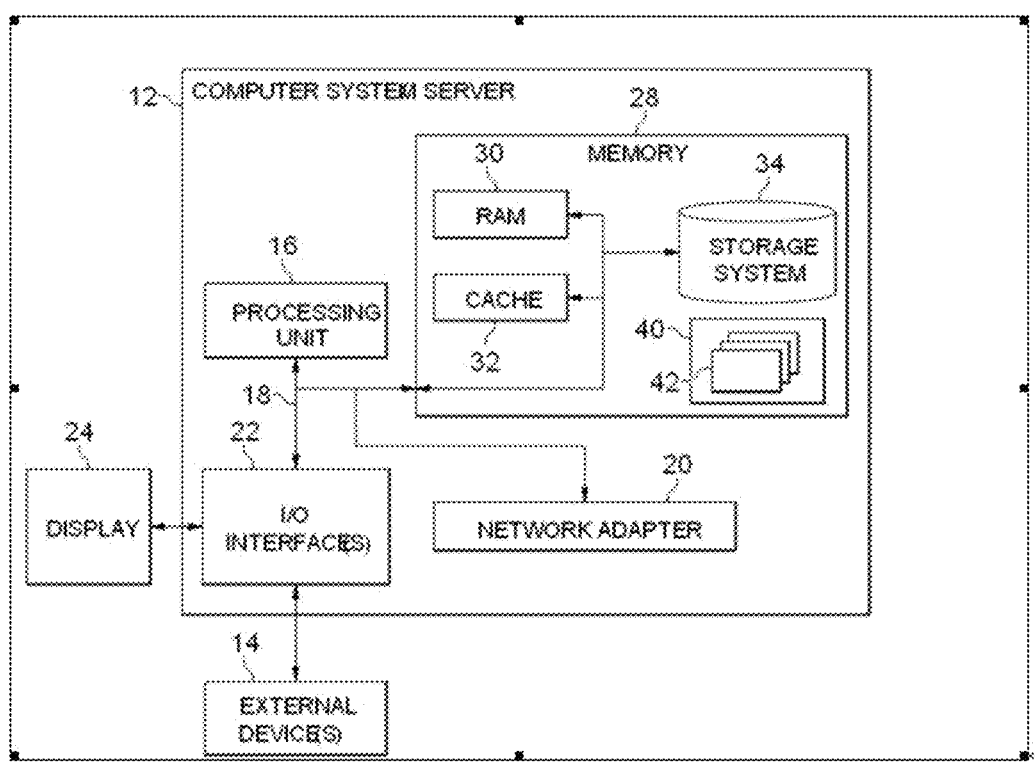
FIG. 1 shows a block diagram of an exemplary computer system/server 12 which is applicable to implement embodiments of the present invention.

Referring now to FIG. 1, in which a block diagram of an exemplary computer system/server 12 which is applicable to implement the embodiments of the present invention is shown. Computer system/server 12 shown in FIG. 1 is only illustrative and is not intended to suggest any limitation as to the scope of use or functionality of embodiments of the invention described herein.

As shown in FIG. 1, computer system/server 12 is represented in the form of a general-purpose computing device. The components of computer system/server 12 may include, but are not limited to, one or more processors or processing units 16, a system memory 28, and a bus 18 that couples various system components, including system memory 28 and processing unit 16.

Bus 18 represents one or more of several types of bus structures, including a memory bus or memory controller, a peripheral bus, an accelerated graphics port, and a processor or local bus using any of a variety of bus architectures. By way of example, and without limitation, such architectures include Industry Standard Architecture (ISA) bus, Micro Channel Architecture (MAC) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown in FIG. 1 and typically called a "hard drive"). Although not shown in FIG. 1, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each drive can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example. Such program modules 42 include, but are not limited to an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
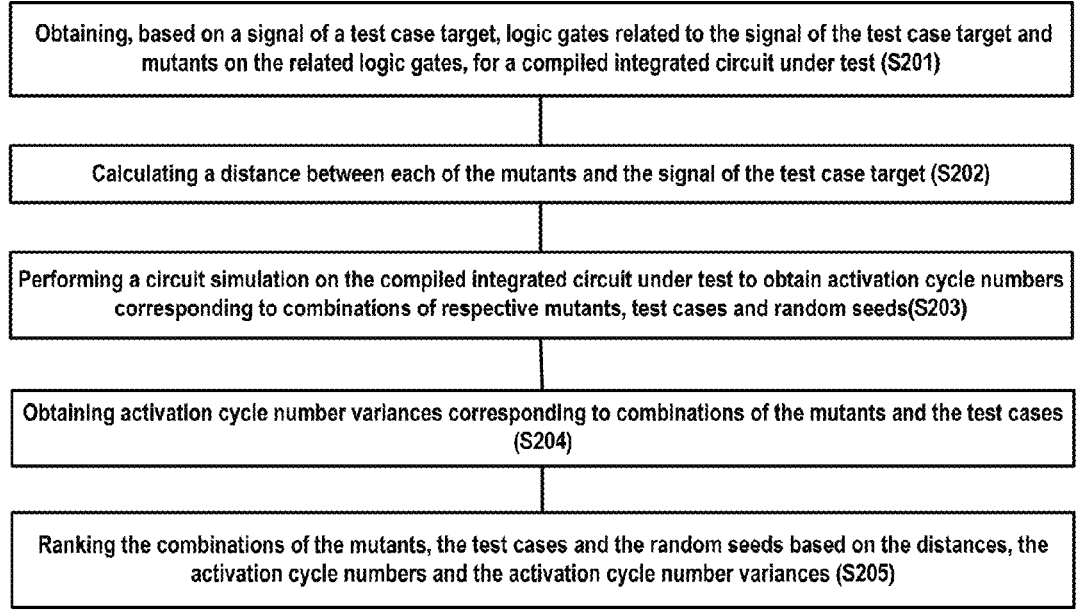
FIG. 2 shows a flow of a method for ranking mutants in mutation testing according to one embodiment of the present invention.

FIG. 2 shows a flow of a method for ranking mutants in mutation testing according to one embodiment of the present invention. According to FIG. 2, in step S201, based on a signal of a test case target, logic gates related to the signal of the test case target and mutants on the related logic gates are obtained for a compiled integrated circuit under test; in step S202, distances between the mutants and the signal of the test case target are calculated; in step S203, a circuit simulation is performed on the compiled integrated circuit under test to obtain activation cycle numbers corresponding to combinations of respective mutants, test cases and random seeds; in step S204, activation cycle number variances corresponding to combinations of the mutants and the test cases are obtained; in step S205, the combinations of the mutants, test cases and random seeds are ranked based on the distances between the mutants and the signal of the test case target, the activation cycle numbers corresponding to the combinations of the mutants, test cases and random seeds, and the activation cycle number variances corresponding to the combinations of the mutants and test cases.

After the ranking, it is possible to select a part of the combinations for the mutation testing simulation, based on the ranked combinations of the mutants, test cases and random seeds.

Figure 3:
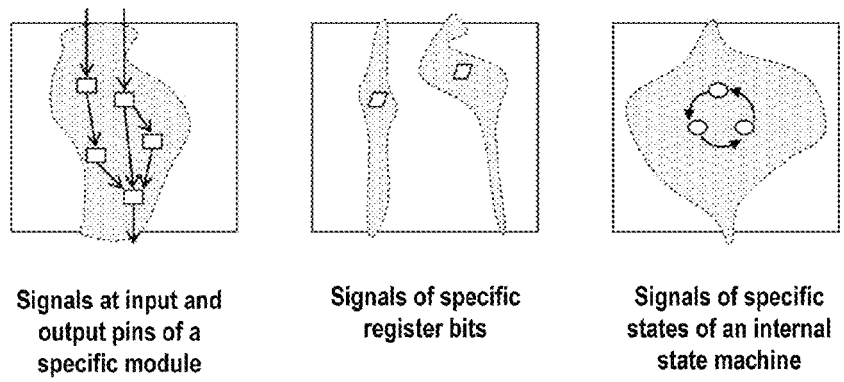
FIG. 3 is a schematic diagram of different first regions determined based on signals of three different test case targets.

In step S201, based on the signal of the test case target, logic gates related to the signal of the test case target and mutants on the related logic gates are obtained for the compiled integrated circuit under test. A region for combining these logic gates is called a first region in the present invention. The first region is a set of all logic gates logically related to the test case. Wherein, the test target is the content that will be tested via the test case. For example, in the above "AND" logic gate example, the target of the test case is to test whether the output of the "AND" logic gate meets the behavior of "AND". In some cases, the signal of the test case target is the output of the logic gate, while in some other cases, the signal of the test case target is an intermediate signal of the logic gate, etc. When determining the first region, the signal of the test case target may comprise the following three different signals, i.e., a signal at input and output pins of a specific module to which the test case is directed, a signal of a specific register bit to which the test case is directed, and a signal of a specific state of an internal state machine to which the test case is directed. FIG. 3 is a schematic diagram of different first regions determined based on signals of three different test case targets. The first regions determined by using signals of different test case targets may be different.

Figure 4:
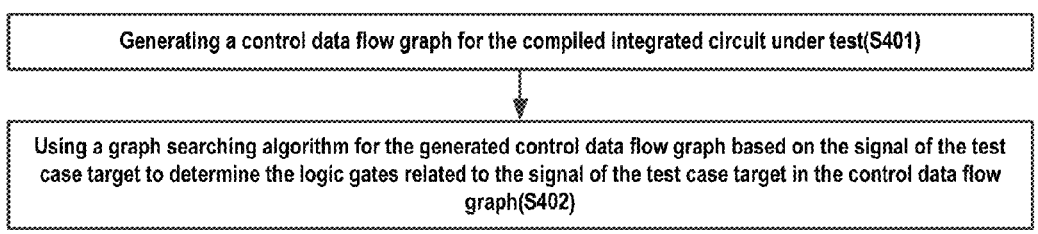
FIG. 4 shows specific implementing steps of obtaining related logic gates in Step S201.
Figure 5:
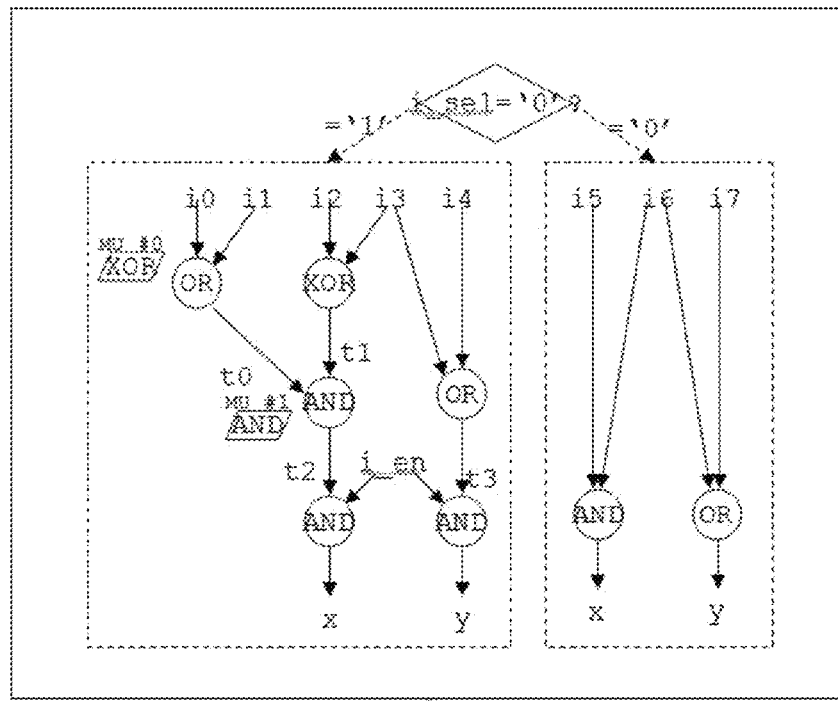
FIG. 5 exemplarily shows a schematic diagram of a control data flow graph generated for a part of an integrated circuit.

FIG. 4 shows particular implementing steps of obtaining the related logic gates in step S201. According to FIG. 4, in step S401, a control data flow graph (CDFG) is generated for the compiled integrated circuit under test. This step is the customary technical means for those skilled in the art and thus the particular implementing method therefor is not described herein. FIG. 5 exemplarily shows a schematic diagram of a control data flow graph generated for a part of an integrated circuit.

Figure 6:
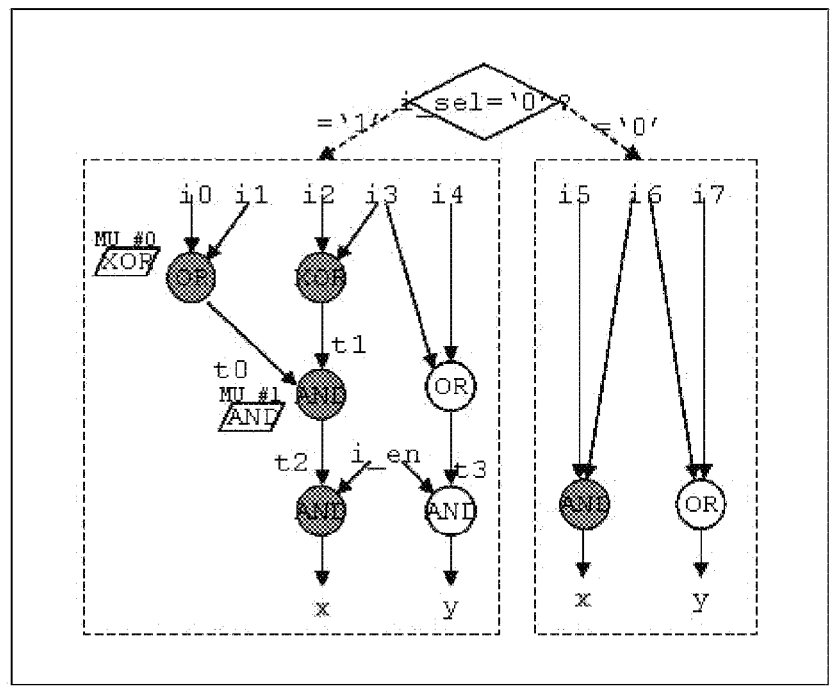
FIG. 6 shows all logic gates related to output signal x in a case that the signal of a given test case target is the output signal x in the control data flow graph as shown in FIG. 5.

In step S402, a graph searching algorithm is used for the generated control data flow graph based on the signal of the test case target to determine the logic gates related to the signal of the test case target in the control data flow graph. The graph searching algorithm is also the customary technical means for those skilled in the art, which is not detailed herein. FIG. 6 shows all logic gates related to output signal x in a case that the signal of a given test case target is the output signal x in the control data flow graph as shown in FIG. 5, wherein all related logic gates are shown as grey circles. Apparently, step S201 may reduce the number of the logic gates to a certain range. For example, the compiled integrated circuit under test has 100,000 logic gates in total, and 20,000 related logic gates can be determined after the analysis.

Regarding the obtaining of the mutants on the related logic gates, one embodiment may use the prior art to firstly generate mutants for all logical gates of the compiled integrated circuit under test; once the related logic gates have been determined in step S402, the mutants on the related logic gates may be obtained. In another embodiment, it is possible to firstly respond to having determined the related logic gates in step S402, and then to generate mutants only for the related logic gates.

After obtaining the first region, the related logic gates and mutants thereon in step S201, it is possible to calculate distances between the mutants and the signal of the test case target in step S202. In the calculation, it is possible to use, based on the control data flow graph, a number of logic gates between the related logic gate and the signal of the test case target or a number of registers between the related logic gate and the signal of the test case target etc. as the distance between the mutant on the related logic gate and the signal of the test case target. The distance is one of the parameters for finally calculating the ranking priorities of the combinations of the mutants, test cases and random seeds. The nearer the distance is, the bigger the probability that the mutant cause an influence on the signal of the test case target is. Thus, the combination of the mutant, a test case and a random seed shall be given a higher priority. With reference to the integrated circuit as shown in FIG. 6, if the number of the separated logic gates is used to calculate the distance between the mutant and the signal of the test case target, then there are two logic gates separated between #0 mutant (MU) and the output signal x of the test case target, and thus the distance is 2. Similarly, the distance between #1 MU and the output signal x of the test case target is 1.

Now referring back to FIG. 2, in the implementing solution of performing the circuit simulation on the compiled integrated circuit under test to obtain the activation cycle numbers corresponding to the combinations of the mutants, test cases and random seeds in step S203, it is possible to perform the following step for each test case: performing the circuit simulation for a predetermined number of times on the compiled integrated circuit under test, wherein in each time of the circuit simulation, one random seed corresponding to the circuit simulation of this time and the activation cycle number for each mutant in the test case are obtained. The mutation testing simulation may use tools including NCSIM, VCS, ModelSim, Mesa, etc. Table 1 shows a simple example for calculating the ranking priorities of the combinations of the mutants, test cases and random seeds. In Table 1, each combination of the mutant, test case and random seed is assigned an identification number, and corresponds to a group of values for the mutant, test case and random seed, that is, a combination. Table 1 includes two mutants, i.e. #0 mutant and #1 mutant, and two test cases, i.e. #0 test case and #1 test case. In fact, in one circuit simulation, all generated mutants are injected to corresponding related logic gates, but the mutants are not activated. Thus, it is possible to simulate the random seeds of this simulation by a common circuit for one test case, and to obtain the activation cycle number for each mutant in this test case. The determined activation cycle number corresponds to a specific random seed. Then, for the same test case, multiple circuit simulations are performed to obtain a random seed corresponding to each circuit simulation, and the activation cycle number for each mutant in this test case. Here, the multiple simulations plus the first simulation may be regarded as the predetermined times of simulations. For example, in Table 1, the predetermined times is 3. Then, for different test cases, the predetermined times of circuit simulations are performed on each test case to obtain a random seed corresponding to each simulation, and the activation cycle number for each mutant in this test case. For example, regarding the example as shown in Table 1, in the first circuit simulation, the combinations identified as 0 and 6 are simulated to obtain a random seed 0x52b3487f and two activation cycle numbers; in the second circuit simulation, the combinations identified as 1 and 7 are simulated to obtain a random seed 0x9837abcf and two activation cycle numbers; in the third circuit simulation, the combinations identified as 2 and 8 are simulated to obtain a random seed 0xab48dce9 and two activation cycle numbers; by this way, 6 circuit simulations in total need to be performed to obtain 6 random seeds and 12 activation cycle numbers. The random seeds needed in the circuit simulations may be input by a user; if no random seed is input, the simulation platform will automatically generate random seeds. A bigger activation cycle number means that the combination of the mutant, test case and random seed more likely influence the output of the integrated circuit under test, and thus shall be given a higher ranking priority.

For the same combination of the mutant and test case, if the activation cycle number obtained using a different random seed changes greatly, then this combination of the mutant, test case and random seed shall be given a higher ranking priority, because this situation means that, regarding the test cases and mutants, the situation triggered by the random seed is an abnormal situation, and can provide the functional verification platform with a bigger test pressure, and thus shall be given a higher ranking priority. The varying situation may be implemented by calculating all activation cycle number variances corresponding to the situations with the same mutant, the same test case and different random seeds in step S204. Calculation of the variance of several values is well-known to those skilled in the art, which is not detailed herein. For example, regarding the example of Table 1, 4 variance values may be obtained.

Ranking the combinations of the mutants, test cases and random seeds based on the distances between the mutants and the signal of the test case target, the activation cycle numbers corresponding to the combinations of the mutants, test cases and random seeds, and the activation cycle number variances corresponding to the combinations of the mutants and test cases in step S205 have been described above, and the ranking criteria for ranking the combinations of the mutants, test cases and random seeds comprises: a higher priority shall be given to the combination with a nearer (smaller) distance; a higher priority shall be given to the combination with a bigger activation cycle number; and a higher priority shall be given to the combination with a bigger activation cycle number variance. In a simple implementation, the priority for a mutant may be calculated using the following formula:

$$P_{m,t,s} = F_s \times \frac{1}{d} + F_d \times \frac{v}{c_{total}} + F_D \times \frac{D}{c_{total}}$$

where, $P_{m,t,s}$ is the ranking priority corresponding to a combination of the mutant, a test case and a random seed; $F_s$ is a static distance adjusting factor which is a number between 0 and 1; $F_d$ is a mutant activation cycle number adjusting factor which is a number between 0 and 1; $F_D$ is a mutant activation cycle number variance adjusting factor which is a number between 0 and 1; d is the distance between the mutant and the signal of the test case target; v is the mutant activation cycle number corresponding to a combination of a mutant, test case and random seed; D is the activation cycle number variance corresponding to the combination of the mutant and the test case; $c_{total}$ is a total number of simulation cycles. Here, F is an adjusting factor respectively for different parts, and allows an engineer to adjust the proportion of different parts based on particular project characteristics. There are many methods for calculating the priority of the combination based on the ranking criteria for ranking the combinations of mutants, test cases and random seeds, and the above formula is only one of them. Those skilled in the art may design a suitable combination priority calculating method based on the above principle.

TABLE 1

| Identifier | Mutant Label | Test Case Label | Random Seed | Number of Simulation Cycles | Number of Mutant Activation Cycles | Static Distance | Mutant Activation Cycle Number Variance | Priority |
|---|---|---|---|---|---|---|---|---|
| 0 | 0 | 0 | 0x52b3487f | 1000 | 999 | 2 | 513 | 2.012 |
| 1 | 0 | 0 | 0x9837abcf | 1000 | 1 | | | 1.014 |
| 2 | 0 | 0 | 0xab48dce9 | 1000 | 293 | | | 1.306 |
| 3 | 1 | 1 | 0x23847287 | 500000 | 398475 | 1 | 45497 | 1.888 |
| 4 | 1 | 1 | 0x89823abf | 520000 | 342343 | | | 1.746 |

TABLE 1-continued

| Identifier | Mutant Label | Test Case Label | Random Seed | Number of Simulation Cycles | Number of Mutant Activation Cycles | Static Distance | Mutant Activation Cycle Number Variance | Priority |
|---|---|---|---|---|---|---|---|---|
| 5 | 1 | 1 | 0x87abce45 | 500500 | 432432 | | | 1.955 |
| 6 | 1 | 0 | 0x52b3487f | 10000 | 343 | | 266 | 1.061 |
| 7 | 1 | 0 | 0x9837abcf | 10000 | 123 | | | 1.039 |
| 8 | 1 | 0 | 0xab48dce9 | 10000 | 654 | | | 1.092 |
| 9 | 0 | 1 | 0x23847287 | 400000 | 0 | 2 | 197616 | 0.994 |
| 10 | 0 | 1 | 0x89823abf | 400000 | 342343 | | | 1.850 |
| 11 | 0 | 1 | 0x87abce45 | 450000 | 124 | | | 0.939 |

Table 1 gives the ranking priority for each combination calculated using the above formula when the adjusting factors of different parts are all 1. It is possible to rank the combinations based on the values of the priorities.

In the ranking results, what ranks the highest (#0 identifier) is the combination of the mutant label 0, the test case label 0 and the specific random seed; what ranks the second-highest (#5 identifier) is the combination of the mutant label 1, the test case label 1 and the specific random seed; by that analogy, the ranking results according to the combination identifiers are: 0, 5, 3, 10, 4, 2, 8, 6, 7, 1, 9 and 11. Thus, the mutation testing simulation may be performed according to the ranked combinations. For example, if only 5 combinations are selected, then the selected identifiers are: 0, 5, 3, 10 and 4. In one embodiment, part of the combinations of the mutants, test cases and random seeds are selected based on the ranking of the combinations of the mutants, test cases and random seeds and testing requirements; and then the mutation simulation is performed on the compiled integrated circuit under test using the selected combinations of the mutants, test cases and random seeds. During the simulation, mutation is enabled.

If the generated mutant is logically related to a certain output signal, then the output signal becomes the target point of the mutant. If the mutant is activated, then the behavior of the target point is expected to change also, that is, also activated. Overall, if the ranking of the combinations of the mutants, test cases and random seeds is proper, then after the circuit simulation, it will be observed that the total activation cycle number for the test case target is very close to the total activation cycle number of the mutant. With the ratio between them, quality of the current ranking can be quantitatively determined. Based on this idea, in one preferred embodiment, the quality of the above combination ranking can be determined by the following formula:

$$Q_p = \frac{\Sigma \text{ activation cycle number for test case target related to selected combinations}}{\text{number of test case targets related to selected combinations} \times \text{average of activation cycle number of selected combinations}}$$

Where, the selected combinations refer to the combinations of mutants, test cases and random seeds selected for mutation testing after ranking the combinations of the mutants, test cases and random seeds, for example, in Table 1, they refer to the combinations with identifiers 0, 5, 3, 10, 4. Each combination has at least one related test case target, and when there is more than one related test case target, it is necessary to obtain via the control data flow graph the number of signals of all test targets corresponding to the mutant as the number of related test case targets. It is common knowledge for those skilled in the art to obtain specifically by the control data flow graph the number of signals of all test targets corresponding to the mutant, which is not detailed herein. Assuming that the numbers of the related test case targets corresponding to the combinations 0, 5, 3, 10 and 4 are respectively 1, 2, 3, 4, 5 and 6, then after activating the #0 combination and enabling the mutation, the activation cycle number of each test case target related to the combination corresponding to the test case target may be obtained by performing the mutation simulation using the random seed 0x52b3487f. For example, regarding #5 combination, based on the above assumption, there are two test case targets, assuming that the activation cycle numbers of the test case targets related to the combination obtained by the mutation simulation are A and B respectively, then in the numerator of the above formula, a sum of A+B is recorded; likewise, it is similar to the other combinations; thus the numerator has the sum obtained by adding the activation cycle numbers of 1+2+3+4+5+6=21 test case targets related to different combinations. In the denominator, the number of the test case targets related to the selected combinations is 21, the activation cycle number of the selected combinations is the average of each number in the column of the mutant activation cycle number of the above 6 combinations in Table 1. In particular, the bigger the $Q_p$ is, the more suitable the selected combinations are, that is, the higher the ranking quality is. Specifically, those skilled in the art may set a threshold for $Q_p$ based on their experience, and only the ranking that corresponds to the combinations corresponding to the $Q_p$ that meets the threshold condition can be accepted; otherwise, it is necessary to re-rank.

Figure 7:
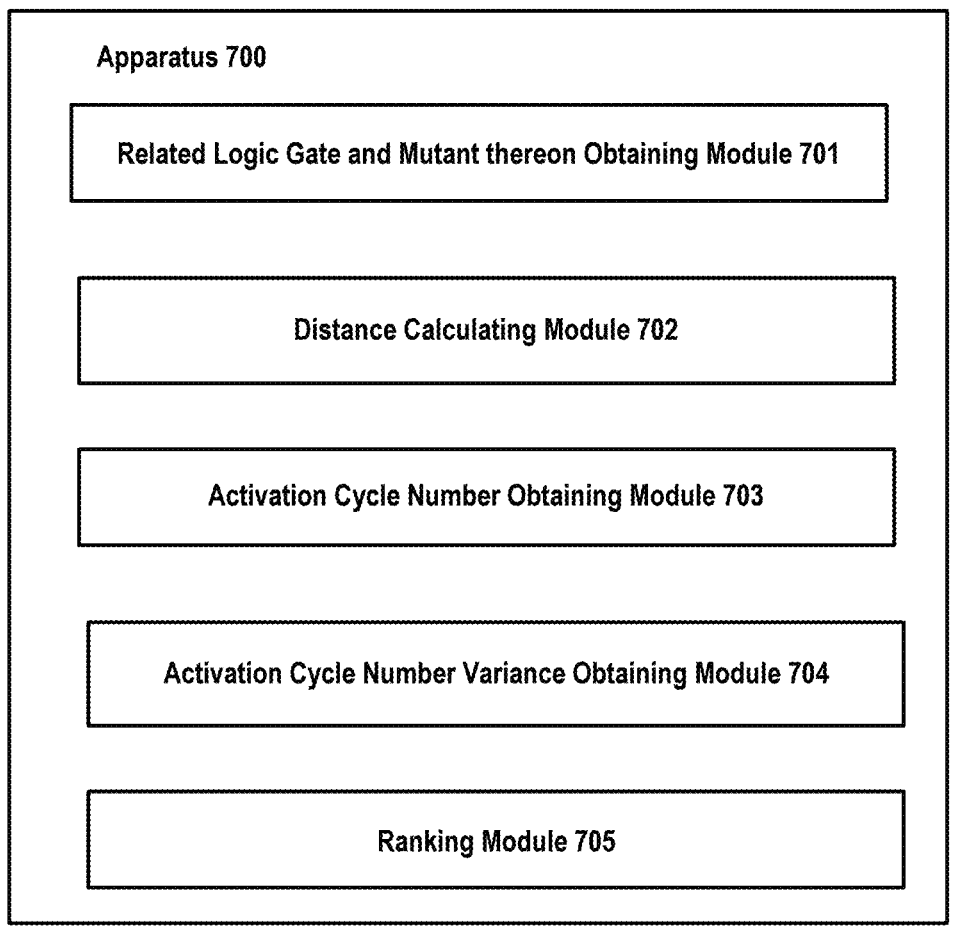
FIG. 7 shows a structural diagram of an apparatus for ranking combinations of mutants, test cases and random seeds in mutation testing.

Within the same inventive concept, the present invention further discloses an apparatus for ranking combinations of mutants, test cases and random seeds in mutation testing. FIG. 7 shows a structural diagram of an apparatus 700 for ranking combinations of mutants, test cases and random seeds in mutation testing. According to FIG. 7, the apparatus comprises: a related logic gate and mutant thereon obtaining module 701 configured to obtain, based on a signal of a test case target, logic gates related to the signal of the test case target and mutants on the related logic gates for a compiled integrated circuit under test; a distance calculating module 702 configured to calculate distances between the mutants and the signal of the test case target; an activation cycle number obtaining module 703 configured to perform a circuit simulation on the compiled integrated circuit under test to obtain activation cycle numbers corresponding to the combinations of the mutants, test cases and random seeds; an activation cycle number variance obtaining module 704 configured to obtain activation cycle number variances corresponding to combinations of the mutants and the test cases; and a ranking module 705 configured to rank the combinations of the mutants, test cases and random seeds based on the distances between the mutants and the signal of the test case target, the activation cycle numbers corresponding to the combinations of the mutants, test cases and random seeds, and the activation cycle number variances corresponding to the combinations of the mutants and test cases.

In one embodiment, the related logic gate and mutant thereon obtaining module comprises: a control data flow graph generating module configured to generate a control data flow graph for the compiled integrated circuit under test; and a related logic gate obtaining module configured to use a graph searching algorithm for the generated control data flow graph based on the signal of the test case target to determine the logic gates related to the signal of the test case target in the control data flow graph.

In one embodiment, the related logic gate and mutant thereon obtaining module obtains the mutants on the related logic gates by one of: (1) generating mutants for all logic gates of the compiled integrated circuit under test, and in response to having determined the related logic gates, obtaining the mutants on the related logic gates; (2) in response to having determined the related logic gates, generating mutants only for the related logic gates.

In one embodiment, the distance calculating module calculates the distances between the mutants and the signal of the test case target by one of: (1) according to the control data flow graph, taking a number of logic gates separated between the related logic gate and the signal of the test case target as the distance between the mutant on the related logic gate and the signal of the test case target; (2) according to the control data flow graph, taking a number of registers separated between the related logic gate and the signal of the test case target as the distance between the mutant on the related logic gate and the signal of the test case target.

In one embodiment, the activation cycle number obtaining module is further configured to perform the following steps for each test case: performing a circuit simulation for a predetermined number of times on the compiled integrated circuit under test, wherein in each time of the circuit simulation, one random seed corresponding to the circuit simulation of this time and the activation cycle number for each of the mutants in the test case are obtained.

In one embodiment, ranking criteria used by the ranking module comprises: (1) the smaller the distance between a mutant and the signal of the test case target is, the higher the ranking priority for the combination of the mutant, a test case and a random seed is; (2) the bigger the activation cycle number corresponding to a combination of a mutant, a test case and a random seed is, the higher the ranking priority for the combination of the mutant, the test case and the random seed is; (3) the bigger the activation cycle number variance corresponding to a combination of a mutant and a test case is, the higher the ranking priority for the combination of the mutant, the test case and a random seed is.

In one embodiment, the ranking module calculates the ranking priority for the combination of a mutant, a test case and a random seed using the following formula:

$$P_{m,t,s} = F_s \times \frac{1}{d} + F_d \times \frac{v}{c_{total}} + F_D \times \frac{D}{c_{total}}$$

where, $P_{m,t,s}$ is the ranking priority corresponding to the combination of the mutant, test case and random seed; $F_s$ is a static distance adjusting factor which is a number between 0 and 1; $F_d$ is a mutant activation cycle number adjusting factor which is a number between 0 and 1; $F_D$ is a mutant activation cycle number variance adjusting factor which is a number between 0 and 1; d is the distance between the mutant and the signal of the test case target; v is the mutant activation cycle number corresponding to the combination of the mutant, test case and random seed; D is the activation cycle number variance corresponding to the combination of the mutant and test case; $c_{total}$ is a total number of simulation cycles.

In one embodiment, the apparatus further comprises (not shown in FIG. 7): a combination selecting module configured to select part of the combinations of the mutants, test cases and random seeds based on the ranking of the combinations of the mutants, test cases and random seeds and testing requirements; and a mutation simulating module configured to perform a mutation simulation on the compiled integrated circuit under test using the selected combinations of the mutants, test cases and random seeds.

In one embodiment, the apparatus further comprises (not shown in FIG. 7): an evaluating module configured to evaluate, using the following formula, whether the selected combinations of the mutants, test cases and random seeds are suitable:

$$Q_p = \frac{\Sigma \text{ activation cycle number for test case target related to selected combinations}}{\text{number of test case targets related to selected combinations} \times \text{average of activation cycle number of selected combinations}}$$

where, the bigger the $Q_p$ is, the more suitable the selected combinations are.

In one embodiment, the apparatus further comprises (not shown in FIG. 7): a re-ranking module configured to re-rank the combinations of the mutants, test cases and random seeds in response that the $Q_p$ does not meet a set threshold.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for ranking combinations of mutants, test cases and random seeds in mutation testing, comprising:

obtaining, using at least one program module of a computing system comprising a processing unit and based on a signal of a test case target, logic gates related to the signal of the test case target and mutants on the related logic gates, for a compiled integrated circuit under test;

calculating, using the at least one program module of the computing system, distances between the mutants and the signal of the test case target; performing a circuit simulation on the compiled integrated circuit under test to obtain activation cycle numbers corresponding to combinations of the mutants, test cases and random seeds;

obtaining, using the at least one program module of the computing system, activation cycle number variances corresponding to combinations of the mutants and the test cases;

ranking, using the at least one program module of the computing system, the combinations of the mutants, the test cases and the random seeds based on the distances, the activation cycle numbers and the activation cycle number variances, which reduces a probability of selecting equivalent mutants related to the mutants generated for multiple logical gates, the test case, and the random seed used in a test simulation;

selecting part of the combinations of the mutants, the test cases and the random seeds which are reduced based on the ranking of the combinations of the mutants, the test cases and the random seeds; and performing a mutation simulation on the compiled integrated circuit under test using the selected combinations of the mutants, the test cases and the random seeds.

2. The method according to claim 1, wherein the obtaining logic gates related to the signal of the test case target for a compiled integrated circuit under test comprises:

generating a control data flow graph for the compiled integrated circuit under test;

using a graph searching algorithm for the generated control data flow graph based on the signal of the test case target to determine the logic gates related to the signal of the test case target in the control data flow graph.

3. The method according to claim 1, wherein the obtaining mutants on the related logic gates uses one of the following:

generating mutants for all logic gates of the compiled integrated circuit under test, and in response to having determined the related logic gates, obtaining the mutants on the related logic gates; or in response to having determined the related logic gates, generating mutants only for the related logic gates.

4. The method according to claim 2, wherein the calculating distances between the mutants and the signal of the test case target uses one of the following:

according to the control data flow graph, taking a number of logic gates separated between the related logic gate and the signal of the test case target as the distance between the mutant on the related logic gate and the signal of the test case target;

according to the control data flow graph, taking a number of registers separated between the related logic gate and the signal of the test case target as the distance between the mutant on the related logic gate and the signal of the test case target.

5. The method according to claim 1, wherein the performing a circuit simulation on the compiled integrated circuit under test to obtain the activation cycle numbers corresponding to combinations of the mutants, test cases and random seeds comprises:

for each test case, performing the following step:

performing the circuit simulation for a predetermined number of times on the compiled integrated circuit under test, wherein in each time of the circuit simulation, one random seed corresponding to the circuit simulation of this time and the activation cycle number for each of the mutants in the test case are obtained.

6. The method according to claim 1, wherein ranking criteria for ranking the combinations of the mutants, the test cases and the random seeds based on the distances between the mutants and the signal of the test case target, the activation cycle numbers corresponding to the combinations of the mutants, the test cases and the random seeds, and the activation cycle number variances corresponding to the combinations of the mutants and the test cases comprises:

the smaller the distance between a mutant and the signal of the test case target is, the higher the ranking priority for the combination of the mutant, a test case and a random seed is;

the bigger the activation cycle number corresponding to the combination of a mutant, a test case and a random seed is, the higher the ranking priority for the combination of the mutant, the test cases and the random seed is;

the bigger the activation cycle number variance corresponding to the combination of a mutant and a test case is, the higher the ranking priority for the combination of the mutant, the test case and a random seed is.

7. The method according to claim 6, wherein the ranking priority for the combination of a mutant, a test case and a random seed is calculated using the following formula:

$$P_{m,t,s} = F_s \times \frac{1}{d} + F_d \times \frac{v}{c_{total}} + F_D \times \frac{D}{c_{total}}$$

where $P_{m,t,s}$ is the ranking priority corresponding to the combination of the mutant, the test case and the random seed; $F_s$ is a static distance adjusting factor which is a number between 0 and 1; $F_d$ is a mutant activation cycle number adjusting factor which is a number between 0 and 1; $F_D$ is a mutant activation cycle number variance adjusting factor which is a number between 0 and 1; d is the distance between the mutant and the signal of the test case target; v is the mutant activation cycle number corresponding to the combination of the mutant, the test case and the random seed; D is the activation cycle number variance corresponding to the combinations of the mutant and the test case; $c_{total}$ is a total number of simulation cycles.

8. The method according to claim 1, wherein the following formula is used to evaluate whether the selected combinations of the mutants, the test cases and the random seeds are suitable:

$$Q_P = \frac{\Sigma \text{ activation cycle number for test case target related to selected combinations}}{\text{number of test case targets related to selected combinations} \times \text{average of activation cycle number of selected combinations}}$$

where the bigger the $Q_p$ is, the more suitable the selected combinations are.

9. The method according to claim 8, further comprising: re-ranking the combinations of the mutants, the test cases and the random seeds in response that the QP does not meet a set threshold.

10. An apparatus comprising a processor of a computing system for ranking combinations of mutants, test cases and random seeds in mutation testing, comprising:

a related logic gate and mutant thereon obtaining module configured to obtain, based on a signal of a test case target, logic gates related to the signal of the test case target and mutants on the related logic gates, for a compiled integrated circuit under test;

a distance calculating module configured to calculate distances between the mutants and the signal of the test case target;

an activation cycle number obtaining module configured to perform a circuit simulation on the compiled integrated circuit under test to obtain activation cycle numbers corresponding to combinations of the mutants, test cases and random seeds;

an activation cycle number variance obtaining module configured to obtain activation cycle number variances corresponding to combinations of the mutants and the test cases;

a ranking module configured to rank the combinations of the mutants, the test cases and the random seeds based on the distances, the activation cycle numbers and the activation cycle number variances; and a combination selecting module configured to select part of the combinations of the mutants, the test cases and the random seeds based on the ranking of the combinations of the mutants, the test cases and the random seeds and testing requirements, thereby reducing an invalid test simulation, wherein the ranking reduces a probability that the combination selecting module will select equivalent mutants related to the mutants generated for multiple logical gates, the test case, and the random seed used in a test simulation, and the related logic gate and mutant thereon obtaining module comprises a control data flow graph generating module configured to generate a control data flow graph for the compiled integrated circuit under test with a reduced number of the related logic gates.

11. The apparatus according to claim 10, wherein the related logic gate and mutant thereon obtaining module comprises:

a related logic gate obtaining module configured to use a graph searching algorithm for the generated control data flow graph based on the signal of the test case target to determine the logic gates related to the signal of the test case target in the control data flow graph.

12. The apparatus according to claim 10, wherein the related logic gate and mutant thereon obtaining module obtains the mutants on the related logic gates by using one of the following:

generating mutants for all logic gates of the compiled integrated circuit under test, and in response to having determined the related logic gates, obtaining the mutants on the related logic gates; or in response to having determined the related logic gates, generating mutants only for the related logic gates.

13. The apparatus according to claim 11, wherein the distance calculating module calculates the distances between the mutants and the signal of the test case target by using one of the following:

according to the control data flow graph, taking a number of logic gates separated between the related logic gate and the signal of the test case target as the distance between the mutant on the related logic gate and the signal of the test case target;

according to the control data flow graph, taking a number of registers separated between the related logic gate and the signal of the test case target as the distance between the mutant on the related logic gate and the signal of the test case target.

14. The apparatus according to claim 10, wherein the activation cycle number obtaining module is further configured to perform the following step for each test case:

performing the circuit simulation for a predetermined number of times on the compiled integrated circuit under test, wherein in each time of the circuit simulation, one random seed corresponding to the circuit simulation of this time and the activation cycle number for each of the mutants in the test case are obtained.

15. The apparatus according to claim 10, wherein ranking criteria used by the ranking module comprises:

the smaller the distance between a mutant and the signal of the test case target is, the higher the ranking priority for the combination of the mutant, a test case and a random seed is;

the bigger the activation cycle number corresponding to a combination of a mutant, a test case and a random seed is, the higher the ranking priority for the combination of the mutant, the test case and the random seed is;

the bigger the activation cycle number variance corresponding to a combination of a mutant and a test case is, the higher the ranking priority for the combination of the mutant, the test case and a random seed is.

16. The apparatus according to claim 15, wherein the ranking module calculates the ranking priority for a combination of a mutant, a test case and a random seed using the following formula:

$$P_{m,t,s} = F_s \times \frac{1}{d} + F_d \times \frac{v}{c_{total}} + F_D \times \frac{D}{c_{total}}$$

where $P_{m,t,s}$ is the ranking priority corresponding to the combination of the mutant, the test case and the random seed; $F_s$ is a static distance adjusting factor which is a number between 0 and 1; $F_d$ is a mutant activation cycle number adjusting factor which is a number between 0 and 1; $F_D$ is a mutant activation cycle number variance adjusting factor which is a number between 0 and 1; d is the distance between the mutant and the signal of the test case target; v is the mutant activation cycle number corresponding to the combination of the mutant, the test case and the random seed; D is the activation cycle number variance corresponding to the combination of the mutant and the test case; $c_{total}$ is a total number of simulation cycles.

17. The apparatus according to claim 15, further comprising:

; and a mutation simulating module configured to perform a mutation simulation on the compiled integrated circuit under test using the selected combinations of the mutants, the test cases and the random seeds.

18. The apparatus according to claim 17, further comprising an evaluating module configured to evaluate, using the following formula, whether the selected combinations of the mutants, the test cases and the random seeds are suitable:

$$Q_p = \frac{\Sigma \text{ activation cycle number for test case target related to selected combinations}}{\text{number of test case targets related to selected combinations} \times \text{average of activation cycle number of selected combinations}}$$

where the bigger the $Q_p$ is, the more suitable the selected combinations are.

19. The apparatus according to claim 18, further comprising:

a re-ranking module configured to re-rank the combinations of the mutants, the test cases and the random seeds in response that the Q P does not meet a set threshold.

* * * * *